US009240788B2

(12) United States Patent
Suzuki et al.

(10) Patent No.: US 9,240,788 B2
(45) Date of Patent: Jan. 19, 2016

(54) SEMICONDUCTOR DEVICE AND COMMUNICATION INTERFACE CIRCUIT

(71) Applicant: SOCIONEXT INC., Yokohama-shi, Kanagawa (JP)

(72) Inventors: Daisuke Suzuki, Hachioji (JP); Masayuki Yamaguchi, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/550,725

(22) Filed: Nov. 21, 2014

(65) Prior Publication Data

US 2015/0155872 A1 Jun. 4, 2015

(30) Foreign Application Priority Data

Dec. 2, 2013 (JP) ................................. 2013-249382

(51) Int. Cl.
| H04B 1/38 | (2015.01) |
| H04L 5/16 | (2006.01) |
| H03K 19/0175 | (2006.01) |
| H03K 19/173 | (2006.01) |

(52) U.S. Cl.
CPC .................. *H03K 19/017581* (2013.01); *H03K 19/017509* (2013.01); *H03K 19/1736* (2013.01)

(58) Field of Classification Search
CPC .................................................. H03K 17/162
See application file for complete search history.

(56) References Cited

U.S. PATENT DOCUMENTS

| 4,725,916 A * | 2/1988 | Oshikiri ................. H02H 3/025 |
| | | 307/29 |
| 5,151,623 A | 9/1992 | Agrawal |
| 6,424,512 B1 * | 7/2002 | Schmacht ............... G05F 1/569 |
| | | 361/93.1 |
| 2007/0081620 A1 * | 4/2007 | Beattie et al. .................. 375/376 |
| 2008/0224728 A1 * | 9/2008 | Park ........................ G11C 5/063 |
| | | 326/30 |
| 2009/0116297 A1 * | 5/2009 | Nam ..................... G11C 29/812 |
| | | 365/189.02 |

FOREIGN PATENT DOCUMENTS

| JP | 5-218199 A | 8/1993 |
| JP | 2007-110711 A | 4/2007 |

* cited by examiner

*Primary Examiner* — Sam K Ahn
*Assistant Examiner* — Fabricio R Murillo Garcia
(74) *Attorney, Agent, or Firm* — Arent Fox LLP

(57) ABSTRACT

A communication interface circuit includes a register and a register setting circuit. The register holds a data value for controlling characteristics of an electronic circuit element included in the communication interface circuit. The register setting circuit changes a wire connection state on the basis of a control signal. The register setting circuit inputs a variable data value to the register to detect the data value corresponding to the characteristics of the electronic circuit element in a first wire connection state, and sets the data value detected in the first wire connection state in the register on the basis of a fixed value in a second wire connection state. A control circuit outputs the above control signal.

16 Claims, 9 Drawing Sheets

SEMICONDUCTOR DEVICE AND COMMUNICATION INTERFACE CIRCUIT

CROSS-REFERENCE TO RELATED APPLICATION

This application is based upon and claims the benefit of priority of the prior Japanese Patent Application No. 2013-249382, filed on Dec. 2, 2013, the entire contents of which are incorporated herein by reference.

FIELD

The embodiments discussed herein are related to a semiconductor device and a communication interface circuit.

BACKGROUND

High-speed I/O (Input/Output) circuits used in servers and the like for an optical communication network are communication interface circuits for data transmission between processors included in the servers or between the servers.

The electrical characteristics of each element included in I/O circuits having such uses are controlled according to variation in the characteristics of circuit elements, a system environment, or the like in order to realize normal high-speed transmission.

Formerly the technique of a programmable cell array in which output from each register is inputted to a programmable multiplexer and in which a signal to be outputted from the multiplexer is determined by the state of each fuse was proposed.

Furthermore, the following technique was proposed. A control unit provides data to a PLL circuit by giving a control signal to an electric fuse array, and exercises control so as to make the PLL circuit operate on the basis of a specific combination of characteristics.

Japanese Laid-open Patent Publication No. 05-218199
Japanese Laid-open Patent Publication No. 2007-110711

An I/O circuit includes registers which are storage elements for control. By setting a determined data value in a register, the electrical characteristics of an element in the I/O circuit are controlled. A data value may be set in a register by software. In this case, however, setting time becomes longer with an increase in the number of registers. Accordingly, a data value may be set in a register by hardware.

However, if an initial data value set in the beginning is not most suitable, then a change in hardware, such as mask revision or mask re-creation, is made to set a data value again. This leads to a decrease in the efficiency of development.

SUMMARY

According to an aspect, there is provided a semiconductor device which includes: a communication interface circuit including a register configured to hold a data value for controlling characteristics of an electronic circuit element included in the communication interface circuit, and a register setting circuit configured to change a wire connection state on the basis of a control signal, the register setting circuit being configured to input a variable data value to the register to detect the data value corresponding to the characteristics of the electronic circuit element in a first wire connection state and set the data value detected in the first wire connection state in the register on the basis of a fixed value in a second wire connection state; and a control circuit configured to output the control signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
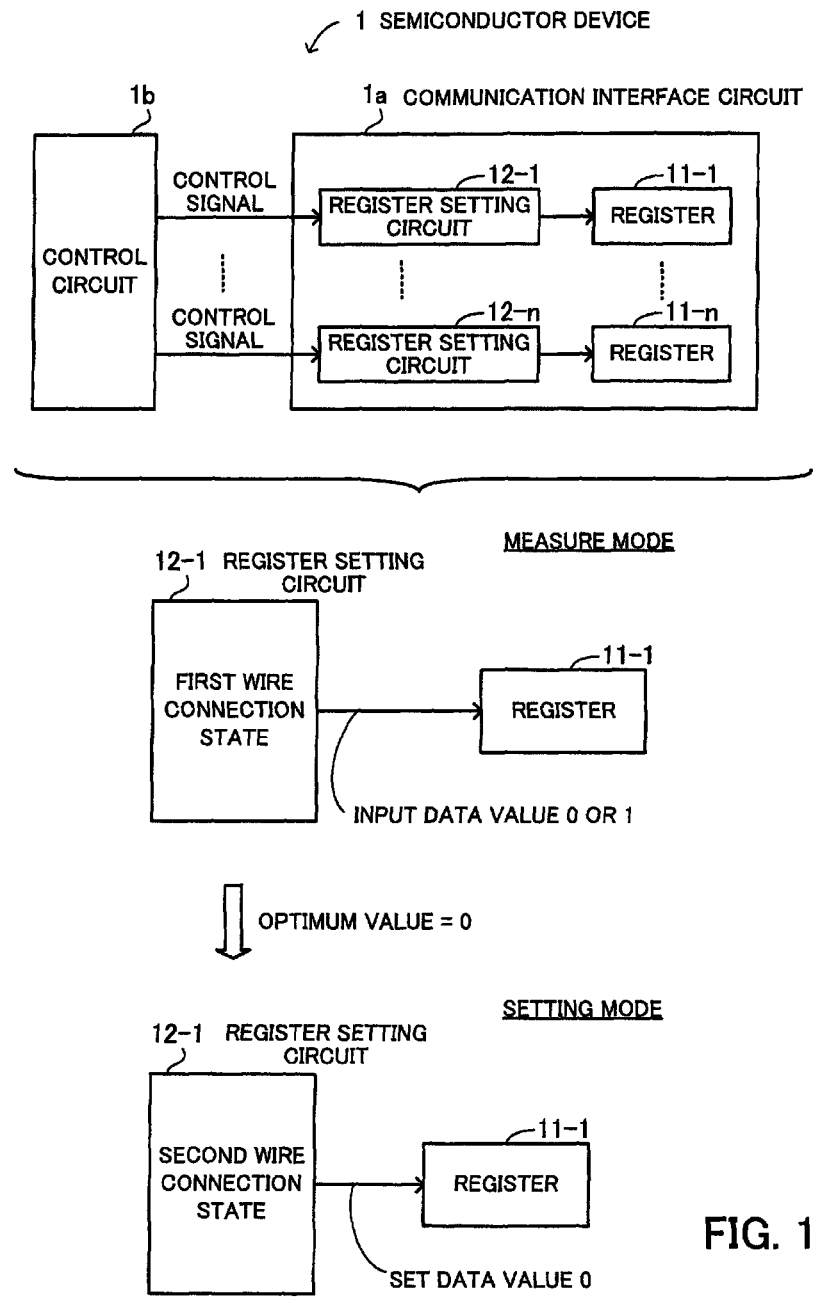
FIG. 1 illustrates an example of a semiconductor device according to a first embodiment.

Embodiments will now be described with reference to the accompanying drawings, wherein like reference numerals refer to like elements throughout.

First Embodiment

FIG. 1 illustrates an example of a semiconductor device according to a first embodiment. A semiconductor device 1 includes a communication interface circuit 1*a* and a control circuit 1*b*. The communication interface circuit 1*a* includes registers 11-1 through 11-*n* and register setting circuits 12-1 through 12-*n*.

Each of the registers 11-1 through 11-*n* is a storage element for controlling the characteristics of an electronic circuit element (not illustrated) arranged in the communication interface circuit 1*a* by a set data value. Each of the register setting circuits 12-1 through 12-*n* changes its wire connection state on the basis of a control signal given by the control circuit 1*b*.

As stated above, the characteristics of each element included in an I/O circuit are controlled according to variation in the characteristics of circuit elements, a system environment, or the like in order to realize normal high-speed transmission.

First each of the register setting circuits 12-1 through 12-*n* is in a first wire connection state at characteristic control time. When the register setting circuits 12-1 through 12-*n* are in the first wire connection state, the register setting circuits 12-1 through 12-*n* input variable data values to the registers 11-1 through 11-*n*, respectively, in order to detect data values corresponding to the characteristics of electronic circuit elements to be changed.

In addition, when the register setting circuits 12-1 through 12-*n* go into a second wire connection state on the basis of control signals, the register setting circuits 12-1 through 12-*n* set data values (optimum values) detected at the time of being in the first wire connection state in the registers 11-1 through 11-*n*, respectively, by the use of fixed values (power-supply potential or GND (ground) potential, for example). The control circuit 1*b* outputs a control signal.

In the following description, a state in which optimum values are detected with the register setting circuits 12-1 through 12-n put into the first wire connection state will be referred to as measure mode and a state in which optimum values are set in the registers 11-1 through 11-n by the use of fixed values will be referred to as setting mode.

In the measure mode, for example, the register setting circuit 12-1 in the semiconductor device 1 is in the first wire connection state. The register setting circuit 12-1 inputs the data value 0 or 1 to the register 11-1.

For example, if the control circuit 1b recognizes that an optimum value of a data value to be set in the register 11-1 corresponding to the characteristics of an electronic circuit is 0, then the register setting circuit 12-1 goes into the second wire connection state on the basis of a control signal. As a result, the semiconductor device 1 makes the transition from the measure mode to the setting mode and sets the data value 0 in the register 11-1 by the use of, for example, the GND potential.

As has been described, with the semiconductor device 1 the measure mode for detecting a data value to be set in a register and the setting mode for setting a detected value are controlled by changing a wire connection state.

If a set data value is not an optimum value, then data value setting has traditionally been performed over again by mask revision or the like in order to obtain optimum characteristics of an electronic circuit. In the first embodiment, on the other hand, a state in which an optimum value is detected in advance in the measure mode and a state in which the detected optimum value is set as an initial value are controlled by changing a wire connection state on the basis of a control signal. As a result, in order to obtain optimum characteristics of an electronic circuit, there is no need to carry out mask revision or the like. This leads to improvement in the efficiency of development.

An example of a problem to be solved will now be described concretely before a semiconductor device according to a second embodiment will be described. Methods for setting an input value in a register of an I/O circuit include a method using software and a method using hardware. As stated above, however, neither of them has the function of changing a data value and detecting in advance a value most suitable for a data value.

An optimum value may change according to a change in system environment, use conditions, or the like. A set data value may not be an optimum value, for example, for this reason. Accordingly, if the method in which a data value is set in a register by the use of software is adopted, then setting is performed again by the use of the software.

However, recent high-speed I/O circuits include a vast number of registers. As a result, a long time may be taken to set data values in registers and may not be negligible from the viewpoint of system design. In addition, the same setting is performed at the time of a shipment test of a device, so time taken to run the shipment test becomes longer. This may lead to a rise in the costs of device fabrication.

On the other hand, if the method in which a data value is set in a register by the use of hardware is adopted and a set data value is not an optimum value, then the hardware itself of a device is changed.

Figure 2:
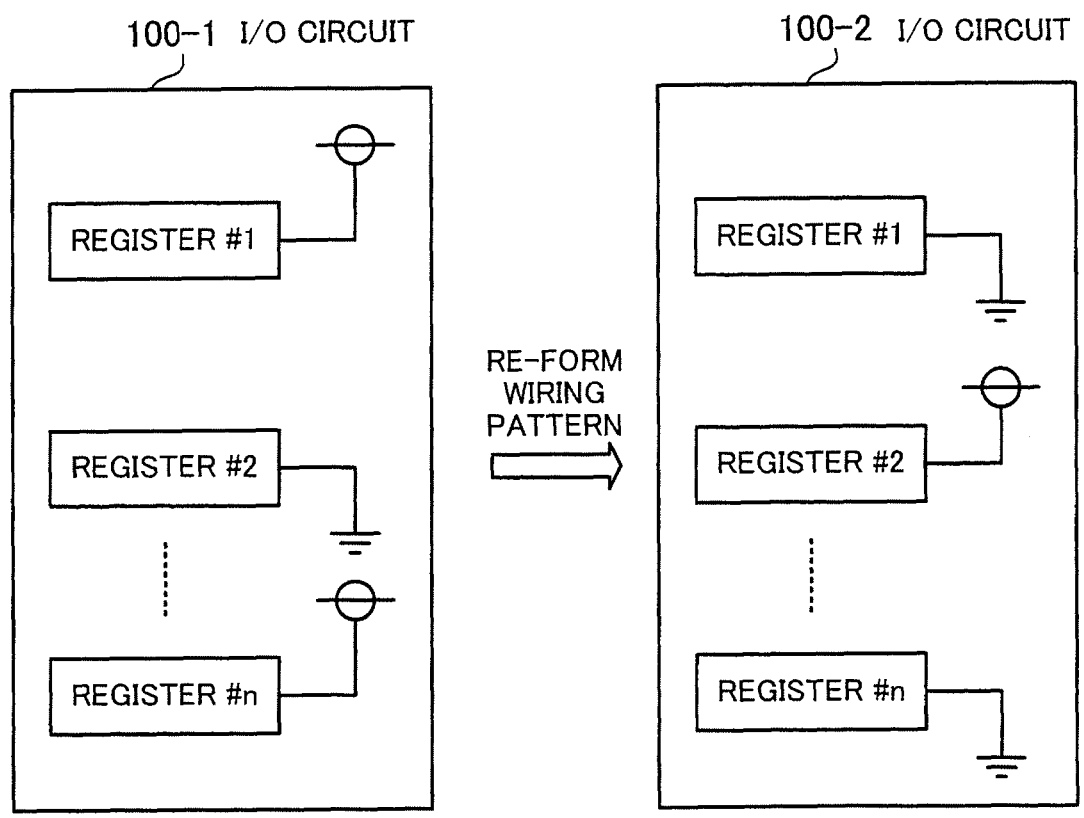
FIG. 2 illustrates an example of a change in hardware.

FIG. 2 illustrates an example of a change in hardware.

An I/O circuit 100-1 includes registers #1 through #n. In the example of FIG. 2, a data value set in each register of the I/O circuit 100-1 is as follows. For example, input to the register #1 is set to power supply, input to the register #2 is set to GND, and input to the register #n is set to the power supply. As a result, the data values 1, 0, and 1 are set in the registers #1, #2, and #n respectively.

It is assumed that after that a change in data value takes place. That is to say, as in an I/O circuit 100-2, it is assumed that input to a register #1 is set to GND, that input to a register #2 is set to power supply, and that input to a register #n is set to GND. As a result, the data values 0, 1, and 0 are set in the registers #1, #2, and #n respectively. In this case, a wiring pattern of the I/O circuit 100-1 is re-formed to create the I/O circuit 100-2.

As has been described, if a data value is fixedly set in a register by the use of hardware, the following problem arises. In order to change the data value set in the register to an optimum value suitable for the conditions of use by a customer after ES (Engineering Sample) evaluation, masks are revised and a device is fabricated again. This lengthens development time and raises the costs.

This embodiment is given with the above problem taken into consideration. An optimum value of a data value in a register is flexibly detected and register setting is performed. As a result, there is no need to, for example, revise masks. Accordingly, there are provided a semiconductor device and a communication interface circuit which improve the efficiency of development.

A semiconductor device according to a second embodiment will now be described.

Second Embodiment

Figure 3:
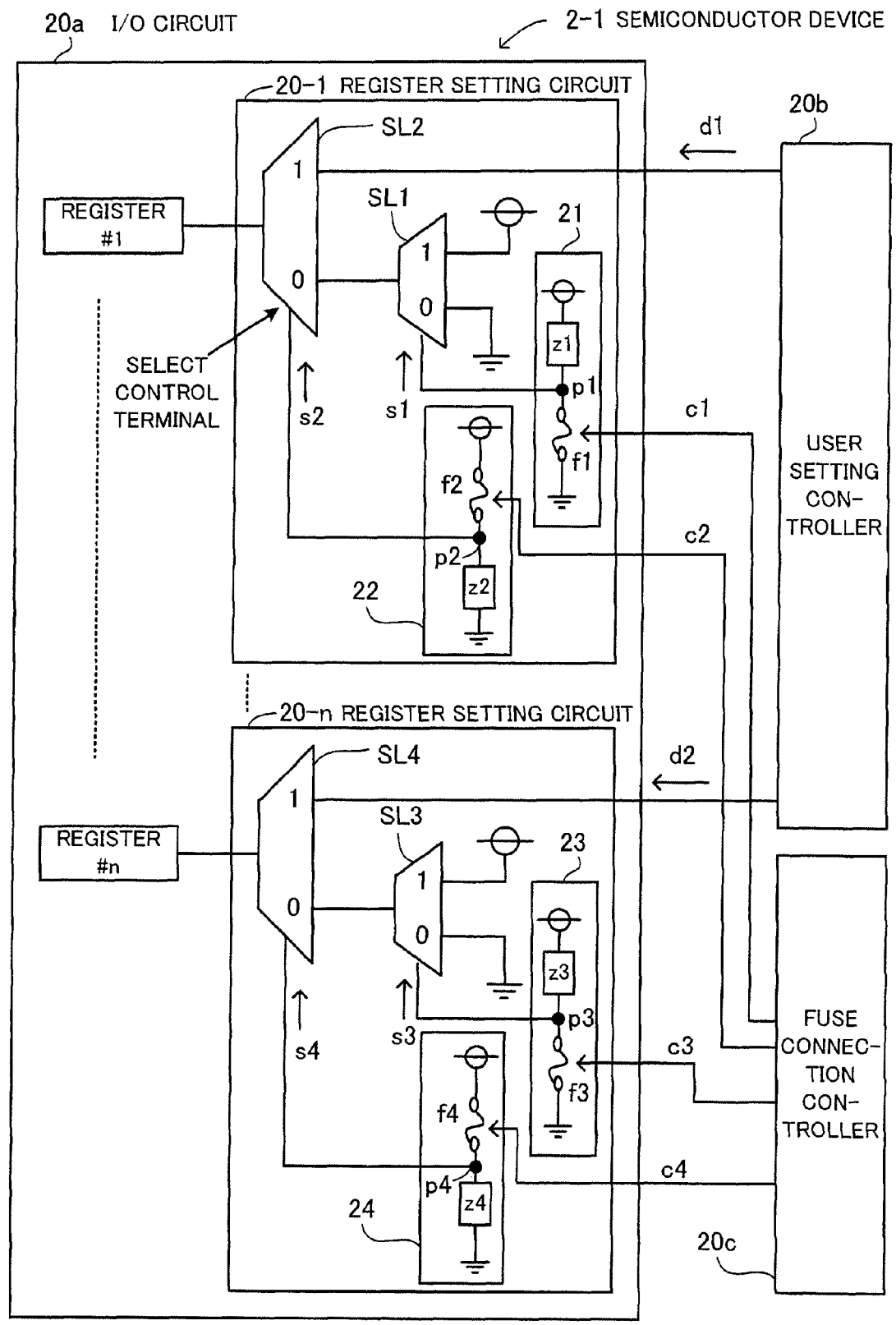
FIG. 3 illustrates an example of a semiconductor device according to a second embodiment.

FIG. 3 illustrates an example of a semiconductor device according to a second embodiment. A semiconductor device 2-1 according to a second embodiment includes an I/O circuit 20a, a user setting controller 20b, and a fuse connection controller 20c.

The I/O circuit 20a has the function of the communication interface circuit 1a illustrated in FIG. 1. Furthermore, the function of the user setting controller 20b and the function of the fuse connection controller 20c are included in the function of the control circuit 1b illustrated in FIG. 1.

The user setting controller 20b or the fuse connection controller 20c may be disposed outside the semiconductor device 2-1. In addition, the user setting controller 20b or the fuse connection controller 20c may be coupled to an external terminal and exercise control over setting in accordance with instructions from the external terminal.

The I/O circuit 20a includes n registers #1 through #n and register setting circuits 20-1 through 20-n corresponding to the registers #1 through #n respectively. The register setting circuit 20-1 sets a data value in the register #1. Similarly, the register setting circuit 20-n sets a data value in the register #n. Structure and operation regarding setting a data value in the registers #1 and #n will now be described.

The register setting circuit 20-1 includes selectors SL1 and SL2 and fuse circuits 21 and 22. The fuse circuit 21 includes a load z1 and a fuse f1. One end of the fuse f1 is coupled to a power supply via the load z1 and is coupled to a select control terminal of the selector SL1. The other end of the fuse f1 is coupled to GND.

The fuse circuit 22 includes a load z2 and a fuse f2. One end of the fuse f2 is coupled to the power supply. The other end of the fuse f2 is coupled to GND via the load z2 and is coupled to a select control terminal of the selector SL2.

Furthermore, a terminal (1) of the selector SL1 is coupled to the power supply and a terminal (0) of the selector SL1 is coupled to GND. A terminal (1) of the selector SL2 is coupled to the user setting controller 20b and a terminal (0) of the selector SL2 is coupled to an output end of the selector SL1. An output end of the selector SL2 is coupled to an input end of the register #1.

If the fuse f1 maintains a connection, then a potential level at an output node p1 coupled to the select control terminal of the selector SL1 is a L (Low) level. If the fuse f1 is disconnected, then a potential level at the output node p1 rises to a H (High) level.

In addition, if the fuse f2 maintains a connection, then a potential level at an output node p2 coupled to the select control terminal of the selector SL2 is a H (High) level. If the fuse f2 is disconnected, then a potential level at the output node p2 drops to a L (Low) level.

Similarly, the register setting circuit 20-n includes selectors SL3 and SL4 and fuse circuits 23 and 24. The fuse circuit 23 includes a load z3 and a fuse f3. One end of the fuse 13 is coupled to the power supply via the load z3 and is coupled to a select control terminal of the selector SL3. The other end of the fuse f3 is coupled to GND.

The fuse circuit 24 includes a load z4 and a fuse f4. One end of the fuse f4 is coupled to the power supply. The other end of the fuse f4 is coupled to GND via the load z4 and is coupled to a select control terminal of the selector SL4.

Furthermore, a terminal (1) of the selector SL3 is coupled to the power supply and a terminal (0) of the selector SL3 is coupled to GND. A terminal (1) of the selector SL4 is coupled to the user setting controller 20b and a terminal (0) of the selector SL4 is coupled to an output end of the selector SL3. An output end of the selector SL4 is coupled to an input end of the register #n.

If the fuse f3 maintains a connection, then a potential level at an output node p3 coupled to the select control terminal of the selector SL3 is a L level. If the fuse f3 is disconnected, then a potential level at the output node p3 rises to a H level.

In addition, if the fuse f4 maintains a connection, then a potential level at an output node p4 coupled to the select control terminal of the selector SL4 is a H level. If the fuse f4 is disconnected, then a potential level at the output node p4 drops to a L level.

The use of the register setting circuits 20-1 through 20-n having the above structure makes it possible to flexibly perform switching between the measure mode and the setting mode by changing the wire connection state. Nonvolatile memories are used as the fuses f1 through f4.

In the measure mode, the user setting controller 20b outputs user setting signals d1 and d2. Each of the user setting signals d1 and d2 is a signal at a H or L level and a user sets each user setting signal to one of the H and L levels.

The fuse connection controller 20c controls the connected and disconnected states of the fuses f1 through f4. In order to put the fuses f1 through f4 into the disconnected state, the fuse connection controller 20c outputs disconnecting signals c1 through c4 corresponding to the fuses f1 through f4 respectively. In order to keep the fuses f1 through f4 in the connected state without disconnecting them, the fuse connection controller 20c stops outputting the disconnecting signals c1 through c4 respectively. The disconnecting signals c1 through c4 are, for example, laser signals or current signals.

As has been described, the semiconductor device 2-1 has the function of outputting a control signal (connecting or disconnecting signal) for disconnecting a fuse in a register setting circuit to change its wire connection state and outputting a user setting signal whose level can be changed to set an optimum level as a data value. This makes it possible to flexibly change the wire connection state of a register setting circuit and the level of a data value.

If a data value is set in the register #1 of the semiconductor device 2-1, first an optimum value of the data value set in the register #1 is detected in the measure mode.

Figure 4:
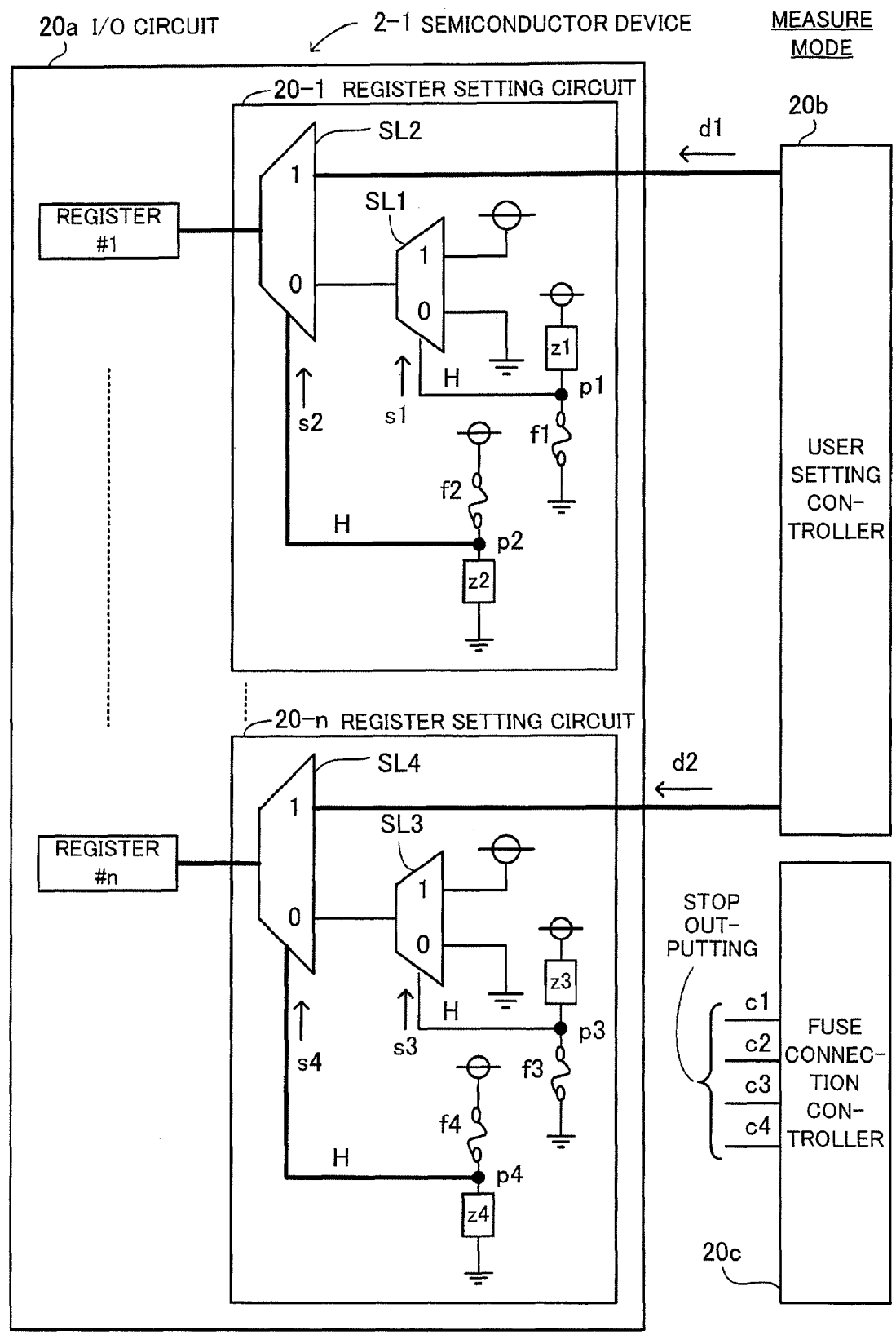
FIG. 4 illustrates a wire connection state in measure mode.

FIG. 4 illustrates a wire connection state in the measure mode. In the measure mode for determining which of the L and H levels is the more suitable for a data value to be set in the register #1, the fuse connection controller 20c stops outputting the disconnecting signal c2 (also stops outputting the disconnecting signal c1 in preparation for control over wire connection in the setting mode).

As a result, the fuse f2 is kept in the connected state. Accordingly, a select signal s2 inputted to the select control terminal of the selector SL2 is at the H level and the user setting signal d1 inputted to the terminal (1) of the selector SL2 is selected as output.

As a result, a level of the user setting signal d1 outputted from the user setting controller 20b is a data value set in the register #1. The user can arbitrarily set a level of the user setting signal d1 to the H or L level, so an optimum value for the register #1 is determined in the measure mode.

Similarly, if a data value is set in the register #n, first an optimum value of the data value set in the register #n is detected in the measure mode. In the measure mode for determining which of the L and H levels is the more suitable for a data value to be set in the register #n, the fuse connection controller 20c stops outputting the disconnecting signal c4 (also stops outputting the disconnecting signal c3 in preparation for control over wire connection in the setting mode).

As a result, the fuse f4 is kept in the connected state. Accordingly, a select signal s4 inputted to the select control terminal of the selector SL4 is at the H level and the user setting signal d2 inputted to the terminal (1) of the selector SL4 is selected as output.

As a result, a level of the user setting signal d2 outputted from the user setting controller 20b is a data value set in the register #n. The user can arbitrarily set a level of the user setting signal d2 to the H or L level, so an optimum value for the register #n is determined in the measure mode.

After an optimum value is detected in the measure mode, the optimum value is actually set in a register as a data value in the next setting mode.

Figure 5:
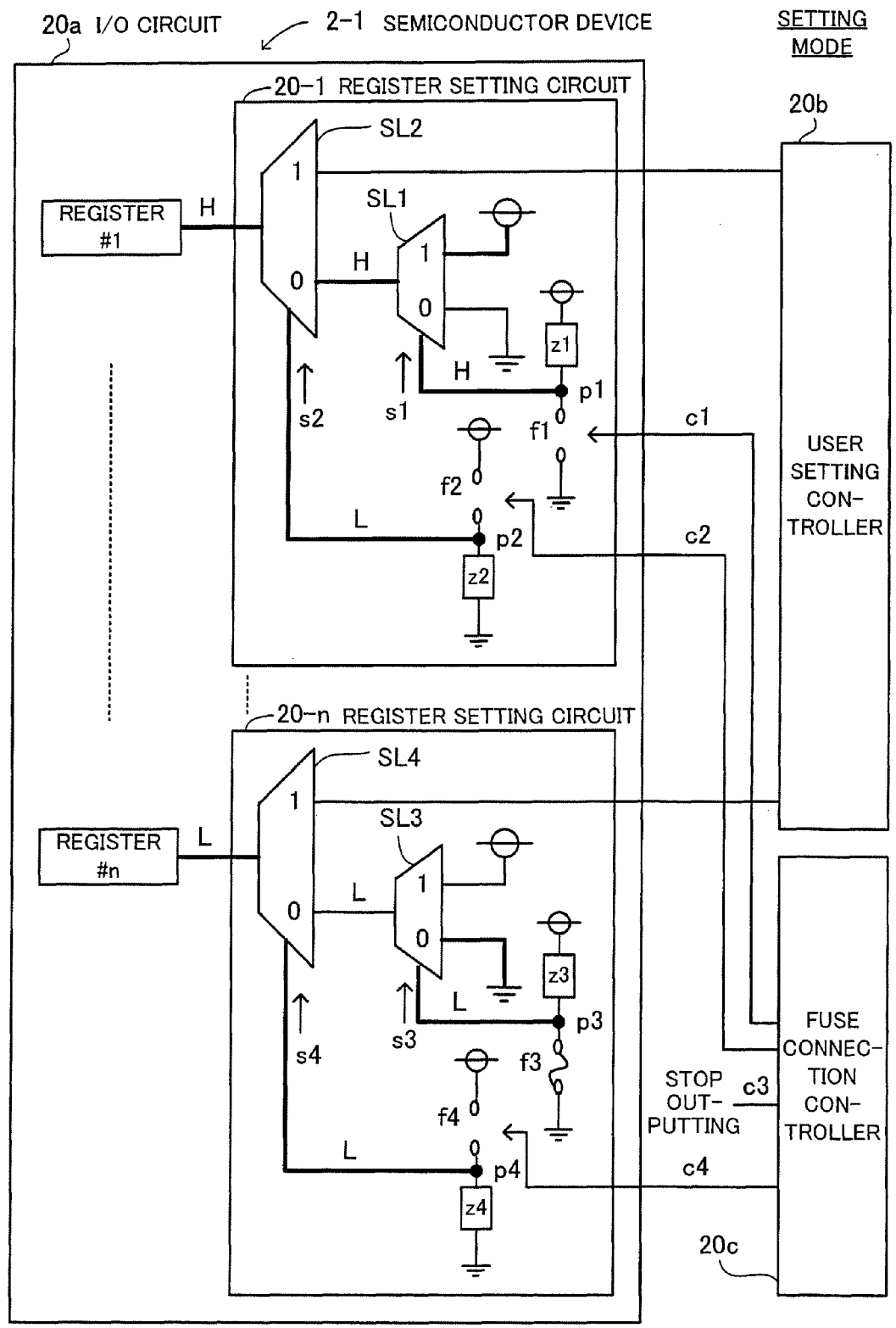
FIG. 5 illustrates a wire connection state in setting mode.

FIG. 5 illustrates a wire connection state in the setting mode. It is assumed that an optimum value of a data value in the register #1 is 1 (H level).

In the setting mode for setting the optimum value in the register #1, the fuse connection controller 20c outputs both of the disconnecting signals c1 and c2. When the fuse connection controller 20c outputs the disconnecting signal c1, the fuse f1 is disconnected. Accordingly, a select signal s1 inputted to the select control terminal of the selector SL1 rises to the H level. As a result, the H level corresponding to the power supply inputted to the terminal (1) of the selector SL1 is selected as output of the selector SL1.

In addition, when the fuse connection controller 20c outputs the disconnecting signal c2, the fuse f2 is disconnected. Accordingly, the select signal s2 inputted to the select control terminal of the selector SL2 drops to the L level. As a result, the output of the selector SL1 inputted to the terminal (0) of the selector SL2, that is to say, the H level corresponding to the power supply is selected as output. This means that 1 (H level corresponding to the power supply) is fixedly set in the register #1 as a data value.

On the other hand, it is assumed that an optimum value of a data value in the register #n is 0 (L level). In the setting mode for setting the optimum value in the register #n, the fuse connection controller 20c stops outputting the disconnecting signal c3 and outputs the disconnecting signal c4.

When the fuse connection controller 20c stops outputting the disconnecting signal c3, the fuse f3 is kept in the connected state. Accordingly, a select signal s3 inputted to the select control terminal of the selector SL3 drops to the L level. As a result, the L level corresponding to GND inputted to the terminal (0) of the selector SL3 is selected as output of the selector SL3.

In addition, when the fuse connection controller 20c outputs the disconnecting signal c4, the fuse f4 is disconnected. Accordingly, the select signal s4 inputted to the select control terminal of the selector SL4 drops to the L level. As a result, the output of the selector SL3 inputted to the terminal (0) of the selector SL4, that is to say, the L level corresponding to GND is selected as output. This means that 0 (L level corresponding to GND) is fixedly set in the register #n as a data value.

As has been described, in the second embodiment register setting circuits each including selectors and fuses are included in an I/O circuit including registers. A method for setting a data value in a register is switched. That is to say, the user sets a data value or a data value is fixed at the power supply level or the GND level.

Furthermore, a fuse is used for controlling a select signal inputted to a selector. Before a fuse is disconnected, the user sets a variable data value in a register in the measure mode. In addition, when an optimum value of a data value is found in the measure mode and the data value is fixed, a proper fuse is disconnected in the setting mode to fixedly set the power supply level or the GND level as the optimum value.

This makes it possible to perform setting after inputting a variable value to a register and measuring a value most suitable for a data value. This obviates the need for operations, such as setting an optimum value again by mask revision or the like after setting a data value in a register. As a result, the efficiency of development improves and development time is reduced.

A semiconductor device according to a third embodiment will now be described.

Third Embodiment

Figure 6:
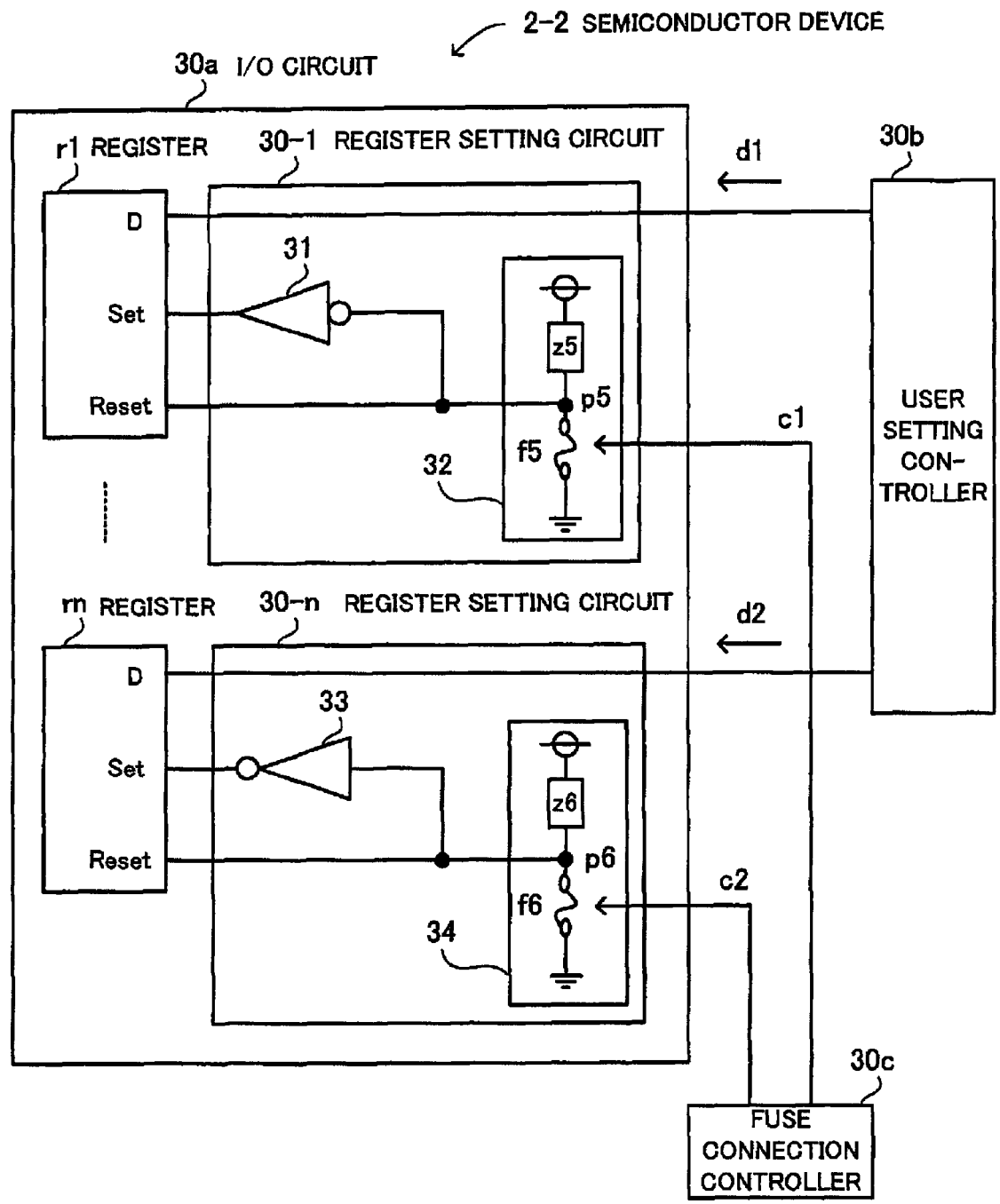
FIG. 6 illustrates an example of a semiconductor device according to a third embodiment.

FIG. 6 illustrates an example of a semiconductor device according to a third embodiment. A semiconductor device 2-2 according to a third embodiment includes an I/O circuit 30a, a user setting controller 30b, and a fuse connection controller 30c.

The I/O circuit 30a has the function of the communication interface circuit 1a illustrated in FIG. 1. Furthermore, the function of the user setting controller 30b and the function of the fuse connection controller 30c are included in the function of the control circuit 1b illustrated in FIG. 1.

The user setting controller 30b or the fuse connection controller 30c may be disposed outside the semiconductor device 2-2. In addition, the user setting controller 30b or the fuse connection controller 30c may be coupled to an external terminal and exercise control over setting in accordance with instructions from the external terminal.

The I/O circuit 30a includes n registers r1 through rn and register setting circuits 30-1 through 30-n corresponding to the registers r1 through rn respectively. The register setting circuit 30-1 sets a data value in the register r1. Similarly, the register setting circuit 30-n sets a data value in the register rn.

Each of the registers r1 through rn has a data input terminal (D), a set terminal (Set), and a reset terminal (Reset) as input terminals.

It is assumed that a combination of a level at the data input terminal, a level at the set terminal, and a level at the reset terminal is represented by (D, S, R). If (D, S, R) is expressed as (high impedance, L, H) by the use of logical values, then a data value set in a register is 0.

Furthermore, if (D, S, R) is expressed as (high impedance, H, L), then a data value set in a register is 1.

In addition, if (D, S, R)=(H, Don't care, Don't care), then a data value set in a register is 1. If (D, S, R)=(L, Don't care, Don't care), then a data value set in a register is 0 ("Don't care" indicates that either of H and L will do, that is to say, an undefined state). Structure and operation regarding setting a data value in the registers r1 and rn will now be described.

The register setting circuit 30-1 includes an inverter 31 and a fuse circuit 32. The fuse circuit 32 includes a load z5 and a fuse f5. One end of the fuse f5 is coupled to a power supply via the load z5, an input end of the inverter 31, and the reset terminal of the register r1. The other end of the fuse f5 is coupled to GND. Furthermore, an output end of the inverter 31 is coupled to the set terminal of the register r1. The data input terminal of the register r1 is coupled to the user setting controller 30b via the register setting circuit 30-1 and a user setting signal d1 is inputted to the data input terminal of the register r1.

If the fuse f5 maintains a connection, then a potential level at an output node p5 coupled to the reset terminal and the input end of the inverter 31 is a L level. If the fuse f5 is disconnected, then a potential level at the output node p5 rises to a H level.

Similarly, the register setting circuit 30-n includes an inverter 33 and a fuse circuit 34. The fuse circuit 34 includes a load z6 and a fuse f6. One end of the fuse f6 is coupled to the power supply via the load z6, an input end of the inverter 33, and the reset terminal of the register rn. The other end of the fuse f6 is coupled to GND. Furthermore, an output end of the inverter 33 is coupled to the set terminal of the register rn. The data input terminal of the register rn is coupled to the user setting controller 30b via the register setting circuit 30-n and a user setting signal d2 is inputted to the data input terminal of the register rn.

If the fuse f6 maintains a connection, then a potential level at an output node p6 coupled to the reset terminal and the input end of the inverter 33 is a L level. If the fuse f6 is disconnected, then a potential level at the output node p6 rises to a H level.

The use of the register setting circuits 30-1 through 30-n having the above structure makes it possible to flexibly perform switching between measure mode and setting mode by changing a wire connection state. Nonvolatile memories are used as the fuses f5 and f6.

The user setting controller 30b outputs the user setting signals d1 and d2. Each of the user setting signals d1 and d2 is a signal at a H or L level and a user sets each user setting signal to one of the H and L levels.

The fuse connection controller 30c controls the connected and disconnected states of the fuses f5 and f6. In order to put the fuses f5 and f6 into the disconnected state, the fuse connection controller 30c outputs disconnecting signals c1 and c2 corresponding to the fuses f5 and f6 respectively. In order to keep the fuses f5 and f6 in the connected state without disconnecting them, the fuse connection controller 30c stops outputting the disconnecting signals c1 and c2 respectively. The disconnecting signals c1 and c2 are, for example, laser signals or current signals.

As has been described, the semiconductor device 2-2 has the function of outputting a control signal (connecting or disconnecting signal) for disconnecting a fuse in a register setting circuit to change its wire connection state and outputting a user setting signal whose level can be changed to set an optimum level as a data value. This makes it possible to flexibly change the wire connection state of a register setting circuit and the level of a data value.

If a data value is set in the register r1 of the semiconductor device 2-2, first an optimum value of the data value is detected in the measure mode. The user setting controller 30b outputs the user setting signal 1 or 0 in the measure mode for determining which of 1 and 0 is the more suitable for a data value to be set in the register r1.

If the data value 1 is set in the register r1, then the register setting circuit 30-1 receives the user setting signal d1 at the H level and inputs it to the data input terminal of the register r1 in its original condition. Furthermore, if the data value 0 is set in the register r1, then the register setting circuit 30-1 receives the user setting signal d1 at the L level and inputs it to the data input terminal of the register r1 in its original condition. At this time the fuse connection controller 30c stops outputting the disconnecting signal c1. This is the same with the register rn.

After an optimum value is detected in the measure mode, the optimum value is actually set in a register as a data value in the next setting mode.

Figure 7:
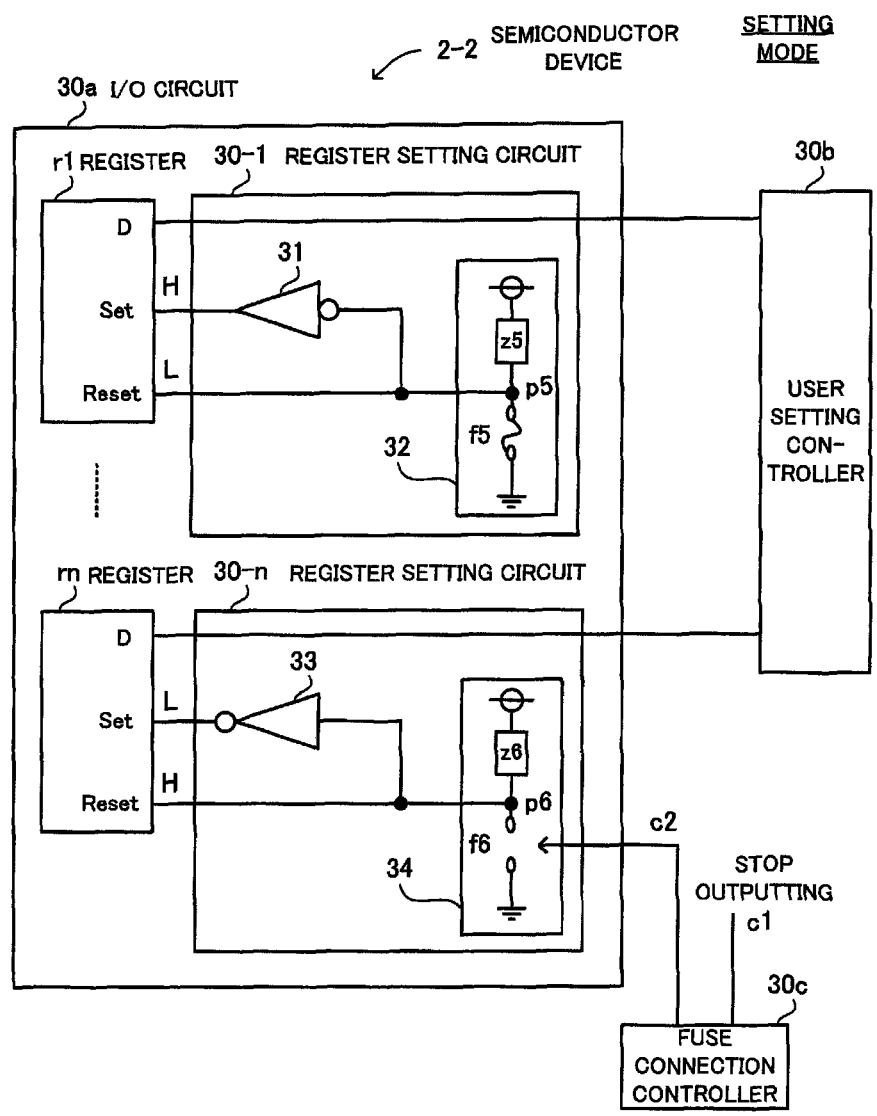
FIG. 7 illustrates a wire connection state in setting mode.

FIG. 7 illustrates a wire connection state in the setting mode. If the data value 1 is set in the register r1, the set terminal and the reset terminal are set to the H and L levels, respectively, on the basis of the above logical values. At this time the fuse connection controller 30c stops outputting the disconnecting signal c1.

As a result, the fuse f5 is kept in a connected state, so the reset terminal of the register r1 and the input end of the inverter 31 are at the L level. Accordingly, the set terminal coupled to the output end of the inverter 31 is at the H level. That is to say, the data value 1 is set in the register r1.

In addition, if the data value 0 is set in the register rn, the set terminal and the reset terminal are set to the L and H levels, respectively, on the basis of the above logical values. At this time the fuse connection controller 30c outputs the disconnecting signal c2.

As a result, the fuse f6 is disconnected, so the reset terminal of the register rn and the input end of the inverter 33 rise to the H level. Accordingly, the set terminal coupled to the output end of the inverter 33 drops to the L level. That is to say, the data value 0 is set in the register rn.

An optimum data value is set in the above way in each of the registers r1 and rn. In the third embodiment a data value can be changed even if a change in register setting takes place after the setting of an optimum value.

For example, if the data value 1 set in the register r1 is changed to 0, then the user setting controller 30b outputs the user setting signal d1 at the L level. By doing so, the register setting circuit 30-1 outputs the user setting signal d1 to the data input terminal of the register r1 in its original condition. As a result, the data value 0 is set in the register r1 on the basis of the above logical values with the fuse f5 kept in a connected state.

Similarly, if the data value 0 set in the register rn is changed to 1, then the user setting controller 30b outputs the user setting signal d2 at the H level. By doing so, the register setting circuit 30-n outputs the user setting signal d2 to the data input terminal of the register rn in its original state. As a result, the data value 1 is set in the register rn on the basis of the above logical values with the fuse f6 kept in a disconnected state.

As has been described, in the third embodiment a set/reset register is used. A data value is changed by fuse setting for changing levels at a set terminal and a reset terminal. In addition, even after a data value is set once in a register, the data value can flexibly be changed by user setting without mask revision or the like.

An example of the entire structure of a semiconductor device will now be described.

(Example of Entire Structure of Semiconductor Device)

Figure 8:
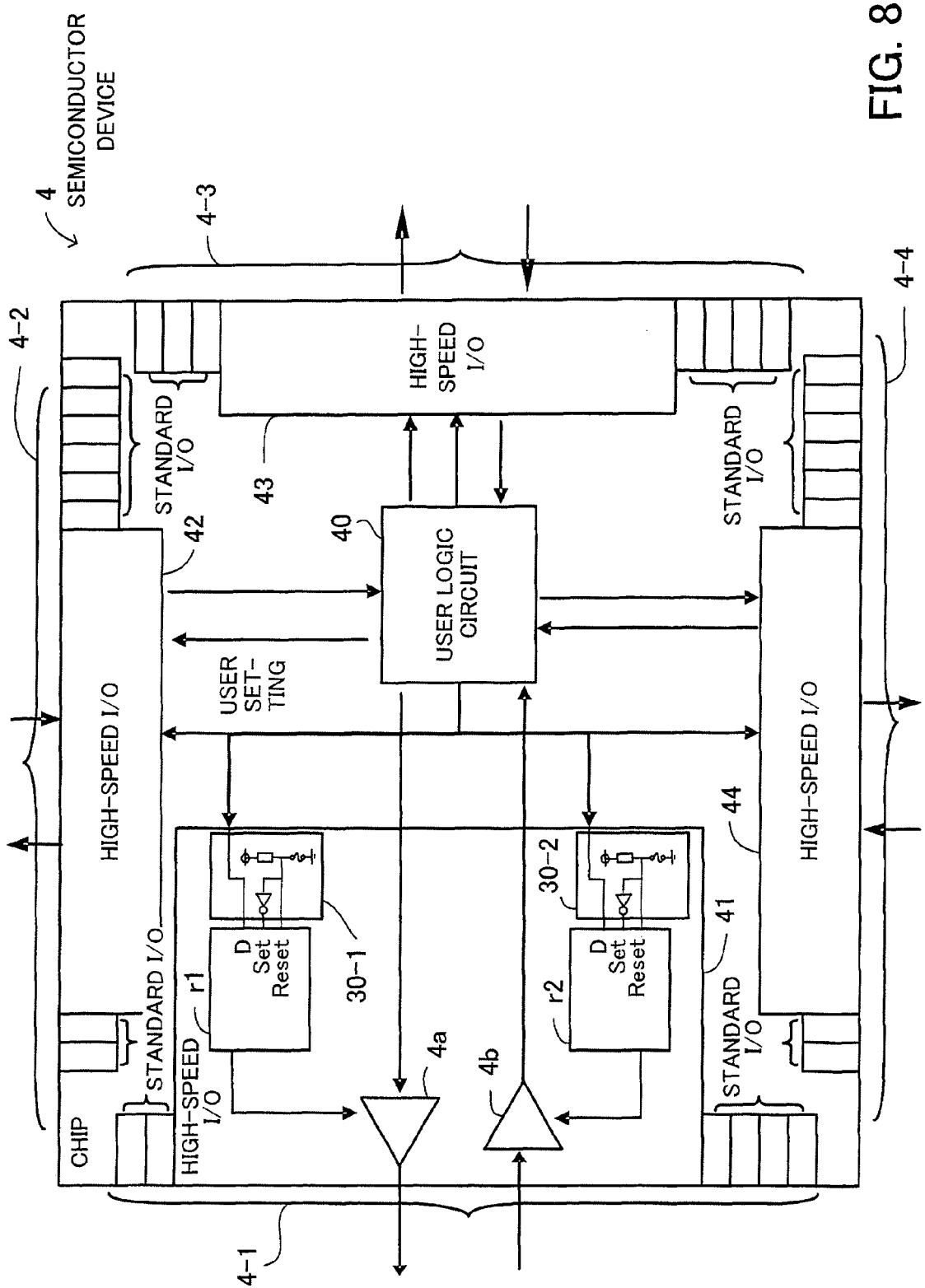
FIG. 8 illustrates an example of the entire structure of a semiconductor device.

FIG. 8 illustrates an example of the entire structure of a semiconductor device. A semiconductor device 4 includes I/O circuit groups 4-1 through 4-4 and a user logic circuit 40.

Each of the I/O circuit groups 4-1 through 4-4 is made up mainly of standard I/O circuits whose processing speed is standard. As illustrated in the example of FIG. 8, however, the I/O circuit groups 4-1 through 4-4 include high-speed I/O circuits 41 through 44, respectively, whose processing speed is higher than that of the standard I/O circuits.

It is assumed that each of the high-speed I/O circuits 41 through 44 has the structure described in the above third embodiment. In this case, the high-speed I/O circuit 41 includes registers r1 and r2 and register setting circuits 30-1 and 30-2. In FIG. 8, the high-speed I/O circuit 41 also includes a buffer (output buffer) 4a and a buffer (input buffer) 4b. Each of the high-speed I/O circuits 42 through 44 has the same structure.

The user logic circuit 40 outputs a user setting signal. With the semiconductor device 4, a fuse connection controller which exercises control over fuse connection is located outside and is not illustrated.

The register setting circuit 30-1 of the high-speed I/O circuit 41 sets a data value in the register r1. The data value set in the register r1 is outputted to the buffer 4a to control the electrical characteristics of the buffer 4a. Furthermore, the register setting circuit 30-2 sets a data value in the register r2. The data value set in the register r2 is outputted to the buffer 4b to control the electrical characteristics of the buffer 4b.

The electrical characteristics of the buffer 4a are rise time and fall time of a signal outputted from the buffer 4a, a sink current value, and the like. These characteristics are controlled by the data value set in the register r1. Furthermore, the electrical characteristics of the buffer 4b are a filter coefficient and the like. The filter coefficient is controlled by the data value set in the register r2.

The flow of SOC (System On Chip) development based on the above embodiments will now be described.

(Example of Flow of SOC Development)

Figure 9:
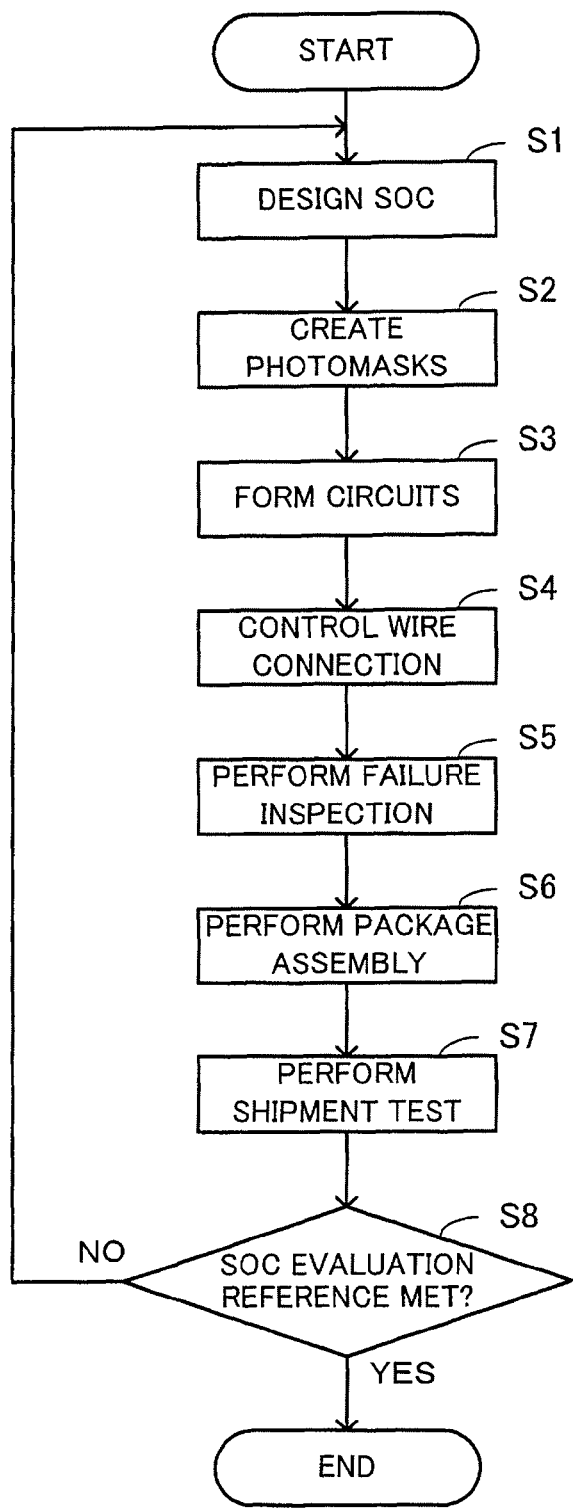
FIG. 9 is a flow chart which indicates an example of the flow of SOC development.

FIG. 9 is a flow chart which indicates an example of the flow of SOC development.

Specification study and circuit design of a SOC are performed in development process S1. Photomasks used for forming circuits on wafers (thin disk-like plates obtained by machining a semiconductor material) are created in development process S2. The circuits are formed on the wafers in development process S3.

A data value is set in a register in development process S4 by controlling wire connection in a register setting circuit. In this case, as stated above, switching is performed between measure mode and setting mode. An optimum value is detected in the measure mode and is set as a data value in the setting mode.

Fabrication failure inspection before package assembly is performed in development process S5. For example, in the stage in which a large number of chips have been formed on the wafers, a wafer test in which the function of each chip is tested is performed before the wafers are cut into individual chips.

The package assembly is performed in development process S6. A shipment test is performed in development process S7 for judging package assembly failure. The final evaluation of the SOC is then performed in development process S8. If evaluation reference is met, then the SOC development ends and mass production is begun. If the evaluation reference is not met, then development process S1 is performed again.

The embodiments have been described in the foregoing. However, a component indicated in each embodiment may be replaced with another unit having the same function. Furthermore, any other component or process may be added.

According to the disclosed semiconductor device and communication interface circuit, the efficiency of development is improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
    a communication interface circuit including:
        a register configured to hold a data value for controlling characteristics of an electronic circuit element included in the communication interface circuit; and
        a register setting circuit configured to change a wire connection state on the basis of a control signal, the register setting circuit being configured to input a variable data value to the register to detect the data value corresponding to the characteristics of the electronic circuit element in a first wire connection state and set the data value detected in the first wire connection state in the register on the basis of a fixed value in a second wire connection state; and
    a control circuit configured to output the control signal for changing the wire connection state by disconnecting a fuse included in the register setting circuit and a user setting signal for changing the data value,
    wherein:
        the register setting circuit includes a first selector with two inputs and one output, a second selector with two inputs and one output, a first fuse circuit including a first fuse, and a second fuse circuit including a second fuse,
        a signal at a first potential level is inputted to a first input terminal of the first selector, a signal at a second potential level lower than the first potential level is inputted to a second input terminal of the first selector, and an output terminal of the first selector is coupled to a second input terminal of the second selector,
        the user setting signal is inputted to a first input terminal of the second selector and a signal outputted from the second selector is inputted to the register,
        the first fuse circuit sets a first output node coupled to a select control terminal of the first selector to a third potential level when the first fuse is in a connected state, and sets the first output node to a fourth potential level higher than the third potential level when the first fuse is in a disconnected state, and
        the second fuse circuit sets a second output node coupled to a select control terminal of the second selector to a fifth potential level when the second fuse is in a connected state, and sets the second output node to a sixth potential level lower than the fifth potential level when the second fuse is in a disconnected state.

2. The semiconductor device according to claim 1, wherein in the first wire connection state:
    the control circuit stops supplying the control signal to the first fuse circuit and the second fuse circuit; and
    the second selector selects the user setting signal inputted to the first input terminal of the second selector in accordance with the second fuse in the register setting circuit being kept in the connected state and the second output node in the register setting circuit being set to the fifth potential level, and inputs the selected user setting signal to the register.

3. The semiconductor device according to claim 1, wherein in order to set 1 in the register in the second wire connection state:
    the control circuit supplies the register setting circuit with the control signals for disconnecting the first fuse and the second fuse; and
    the first selector selects the signal at the first potential level inputted to the first input terminal of the first selector in accordance with the first output node in the register setting circuit being set to the fourth potential level, and outputs the selected signal at the first potential level, and
    the second selector selects the signal at the first potential level inputted to the second input terminal of the second selector in accordance with the second output node in the register setting circuit being set to the sixth potential level, and inputs the selected signal at the first potential level to the register.

4. The semiconductor device according to claim 1, wherein in order to set 0 in the register in the second wire connection state:
    the control circuit supplies the register setting circuit with the control signals for keeping the first fuse in the connected state and disconnecting the second fuse; and
    the first selector selects the signal at the second potential level inputted to the second input terminal of the first selector in accordance with the first output node in the register setting circuit being set to the third potential level, and outputs the selected signal at the second potential level, and
    the second selector selects the signal at the second potential level inputted to the second input terminal of the second selector in accordance with the second output node in the register setting circuit being set to the sixth potential level, and inputs the selected signal at the second potential level to the register.

5. A semiconductor device comprising:
    a communication interface circuit including:
        a register configured to hold a data value for controlling characteristics of an electronic circuit element included in the communication interface circuit; and
        a register setting circuit configured to change a wire connection state on the basis of a control signal, the register setting circuit being configured to input a variable data value to the register to detect the data value corresponding to the characteristics of the electronic circuit element in a first wire connection state and set the data value detected in the first wire connection state in the register on the basis of a fixed value in a second wire connection state; and
    a control circuit configured to output the control signal for changing the wire connection state by disconnecting a fuse included in the register setting circuit and a user setting signal for changing the data value,
    wherein:
        the register has a data input terminal, a set terminal, and a reset terminal, the register setting circuit includes an inverter and a fuse circuit including a fuse, the user setting signal is inputted to the data input terminal, an output node of the inverter is coupled to the set terminal, an output node of the fuse circuit is coupled to the reset terminal and an input node of the inverter, and the fuse circuit sets the output node of the fuse circuit to a first potential level when the fuse is in a connected state, and sets the output node of the fuse circuit to a second potential level higher than the first potential level when the fuse is in a disconnected state.

6. The semiconductor device according to claim 5, wherein in the first wire connection state and the second wire connection state, the register setting circuit inputs a variable data value to the data input terminal of the register in accordance with a potential level of the user setting signal.

7. The semiconductor device according to claim 6, wherein in order to set 1 in the register in the second wire connection state:

the control circuit supplies the register setting circuit with the control signal for keeping the fuse in the connected state; and the register setting circuit inputs a signal at the first potential level to the reset terminal and a signal at a third potential level higher than the first potential level to the set terminal, in accordance with the output node of the fuse circuit being set to the first potential level.

8. The semiconductor device according to claim 6, wherein in order to set 0 in the register in the second wire connection state:

the control circuit supplies the register setting circuit with the control signal for disconnecting the fuse; and the register setting circuit inputs a signal at the second potential level to the reset terminal and a signal at a fourth potential level lower than the second potential level to the set terminal, in accordance with the output node of the fuse circuit being set to the second potential level.

9. A communication interface circuit comprising:

a register configured to hold a data value for controlling characteristics of an electronic circuit element included in the communication interface circuit; and a register setting circuit configured to change a wire connection state on the basis of a control signal, the register setting circuit being configured to input a variable data value to the register to detect the data value corresponding to the characteristics of the electronic circuit element in a first wire connection state and set the data value detected in the first wire connection state in the register on the basis of a fixed value in a second wire connection state, wherein:

the communication interface circuit is configured to receive the control signal for changing the wire connection state by disconnecting a fuse included in the register setting circuit and a user setting signal for changing the data value, the register setting circuit includes a first selector with two inputs and one output, a second selector with two inputs and one output, a first fuse circuit including a first fuse, and a second fuse circuit including a second fuse, a signal at a first potential level is inputted to a first input terminal of the first selector, a signal at a second potential level lower than the first potential level is inputted to a second input terminal of the first selector, and an output terminal of the first selector is coupled to a second input terminal of the second selector, the user setting signal is inputted to a first input terminal of the second selector and a signal outputted from the second selector is inputted to the register, the first fuse circuit sets a first output node coupled to a select control terminal of the first selector to a third potential level when the first fuse is in a connected state, and sets the first output node to a fourth potential level higher than the third potential level when the first fuse is in a disconnected state, and the second fuse circuit sets a second output node coupled to a select control terminal of the second selector to a fifth potential level when the second fuse is in a connected state, and sets the second output node to a sixth potential level lower than the fifth potential level when the second fuse is in a disconnected state.

10. The communication interface circuit according to claim 9, wherein in the first wire connection state:

the control signal is not inputted to the first fuse circuit and the second fuse circuit; and the second selector selects the user setting signal inputted to the first input terminal of the second selector in accordance with the second fuse in the register setting circuit being kept in the connected state and the second output node in the register setting circuit being set to the fifth potential level, and inputs the selected user setting signal to the register.

11. The communication interface circuit according to claim 9, wherein in order to set 1 in the register in the second wire connection state:

the register setting circuit receives the control signals for disconnecting the first fuse and the second fuse; and the first selector selects the signal at the first potential level inputted to the first input terminal of the first selector in accordance with the first output node in the register setting circuit being set to the fourth potential level, and outputs the selected signal at the first potential level, and the second selector selects the signal at the first potential level inputted to the second input terminal of the second selector in accordance with the second output node in the register setting circuit being set to the sixth potential level, and inputs the selected signal at the first potential level to the register.

12. The communication interface circuit according to claim 9, wherein in order to set 0 in the register in the second wire connection state:

the register setting circuit receives the control signals for keeping the first fuse in the connected state and disconnecting the second fuse; and the first selector selects the signal at the second potential level inputted to the second input terminal of the first selector in accordance with the first output node in the register setting circuit being set to the third potential level, and outputs the selected signal at the second potential level, and the second selector selects the signal at the second potential level inputted to the second input terminal of the second selector in accordance with the second output node in the register setting circuit being set to the sixth potential level, and inputs the selected signal at the second potential level to the register.

13. A communication interface circuit comprising:

a register configured to hold a data value for controlling characteristics of an electronic circuit element included in the communication interface circuit; and a register setting circuit configured to change a wire connection state on the basis of a control signal, the register setting circuit being configured to input a variable data value to the register to detect the data value corresponding to the characteristics of the electronic circuit element in a first wire connection state and set the data value detected in the first wire connection state in the register on the basis of a fixed value in a second wire connection state, wherein:

the communication interface circuit is configured to receive the control signal for changing the wire connection state by disconnecting a fuse included in the register setting circuit and a user setting signal for changing the data value, the register has a data input terminal, a set terminal, and a reset terminal, the register setting circuit includes an inverter and a fuse circuit including a fuse, the user setting signal is inputted to the data input terminal, an output node of the inverter is coupled to the set terminal, an output node of the fuse circuit is coupled to the reset terminal and an input node of the inverter, and the fuse circuit sets the output node of the fuse circuit to a first potential level when the fuse is in a connected state, and sets the output node of the fuse circuit to a second potential level higher than the first potential level when the fuse is in a disconnected state.

14. The communication interface circuit according to claim 13, wherein in the first wire connection state and the second wire connection state, the register setting circuit inputs a variable data value to the data input terminal of the register in accordance with a potential level of the user setting signal.

15. The communication interface circuit according to claim 14, wherein in order to set 1 in the register in the second wire connection state:

the register setting circuit receives the control signal for keeping the fuse in the connected state; and the register setting circuit inputs a signal at the first potential level to the reset terminal and a signal at a third potential level higher than the first potential level to the set terminal, in accordance with the output node of the fuse circuit being set to the first potential level.

16. The communication interface circuit according to claim 14, wherein in order to set 0 in the register in the second wire connection state:

the register setting circuit receives the control signal for disconnecting the fuse; and the register setting circuit inputs a signal at the second potential level to the reset terminal and a signal at a fourth potential level lower than the second potential level to the set terminal, in accordance with the output node of the fuse circuit being set to the second potential level.

* * * * *